US012787500B2

(12) United States Patent
Kim et al.

(10) Patent No.: US 12,787,500 B2
(45) Date of Patent: Nov. 3, 2026

(54) LIGHT-EMITTING DEVICE, DISPLAY APPARATUS INCLUDING THE SAME, AND METHOD OF MANUFACTURING THE SAME

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Dongho Kim, Suwon-si (KR); Ho Won Jang, Seoul (KR); Kyungwook Hwang, Suwon-si (KR); Junsik Hwang, Suwon-si (KR); Sohyeon Park, Seoul (KR); Jehong Oh, Uiwang-si (KR); Jungel Ryu, Uiwang-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 587 days.

(21) Appl. No.: 18/215,377

(22) Filed: Jun. 28, 2023

(65) Prior Publication Data

US 2024/0006554 A1 Jan. 4, 2024

(30) Foreign Application Priority Data

Jul. 4, 2022 (KR) ........................ 10-2022-0082131

(51) Int. Cl.
*H01L 33/24* (2010.01)
*H10H 20/813* (2025.01)
(Continued)

(52) U.S. Cl.
CPC ........ *H10H 20/821* (2025.01); *H10H 20/813* (2025.01); *H10H 20/8312* (2025.01);
(Continued)

(58) Field of Classification Search
CPC ............... H10H 20/821; H10H 20/813; H10H 20/8312; H10H 20/8314; H10H 20/833;
(Continued)

(56) References Cited

U.S. PATENT DOCUMENTS 9,722,145 B2 8/2017 Sasaki et al.
9,825,202 B2 11/2017 Schuele et al.
(Continued)

FOREIGN PATENT DOCUMENTS

EP 3 005 429 B1 5/2020
EP 3 323 152 B1 10/2021
(Continued)

OTHER PUBLICATIONS

Communication dated Nov. 30, 2023, issued by the European Patent Office in counterpart European Application No. 23151126.2.
(Continued)

*Primary Examiner* — Mohammed R Alam
(74) *Attorney, Agent, or Firm* — Sughrue Mion, PLLC

(57) ABSTRACT

A light-emitting device may include a plurality of light-emitting rods. Each of the plurality of light-emitting rods may include a first semiconductor layer having a rod shape, an active layer having a shell shape disposed about a plurality of surfaces of the first semiconductor layer, and a second semiconductor layer having a shell shape disposed about a plurality of surfaces of the active layer. The light emitting device may further include an insulating layer disposed in spaces between the plurality of light-emitting rods; a transparent electrode electrically connected to the first semiconductor layer of each of the plurality of light-emitting rods; and a reflective electrode electrically connected to the second semiconductor layer of each of the plurality of light-emitting rods.

18 Claims, 25 Drawing Sheets

(51) Int. Cl.

| | |
|---|---|
| ***H10H 20/821*** | (2025.01) |
| ***H10H 20/831*** | (2025.01) |
| ***H10H 20/832*** | (2025.01) |
| ***H10H 20/833*** | (2025.01) |

(52) U.S. Cl.

CPC ...... *H10H 20/8314* (2025.01); *H10H 20/833* (2025.01); *H10H 20/835* (2025.01)

(58) Field of Classification Search

CPC ............... H10H 20/835; H10H 20/819; H10H 20/8252; H10H 20/0137; H10H 20/81; H10H 20/84; H10H 29/142; H10H 20/857; H10H 20/032; H10H 20/8513; H01L 25/0753; H01L 25/167; G09F 9/33; H10D 86/40; H10D 86/60

See application file for complete search history.

(56) References Cited

U.S. PATENT DOCUMENTS

| | | | | |
|---|---|---|---|---|
| 9,917,226 | B1 | 3/2018 | Heine et al. | |
| 10,243,097 | B2 | 3/2019 | Yuen | |
| 10,418,527 | B2 | 9/2019 | Sasaki et al. | |
| 10,475,958 | B2 | 11/2019 | Zhan et al. | |
| 10,825,702 | B2 | 11/2020 | Shim et al. | |
| 2010/0207156 | A1* | 8/2010 | Cho | H10H 20/857 257/E33.056 |
| 2011/0254034 | A1* | 10/2011 | Konsek | H10H 20/813 257/E33.072 |
| 2011/0303937 | A1* | 12/2011 | Lai | H10H 20/832 257/E33.072 |
| 2013/0112944 | A1 | 5/2013 | Cha et al. | |
| 2016/0013362 | A1* | 1/2016 | Heo | H05B 45/00 315/291 |
| 2016/0155897 | A1* | 6/2016 | Yoo | H10H 20/852 257/13 |
| 2019/0295992 | A1 | 9/2019 | Ahmed et al. | |
| 2021/0159361 | A1 | 5/2021 | Hwang et al. | |
| 2021/0249556 | A1 | 8/2021 | Hwang et al. | |
| 2022/0005865 | A1 | 1/2022 | Ikeda et al. | |
| 2022/0173275 | A1 | 6/2022 | Hwang et al. | |
| 2022/0189810 | A1 | 6/2022 | Hwang et al. | |

FOREIGN PATENT DOCUMENTS

| | | | |
|---|---|---|---|
| KR | 10-2011-0039313 | A | 4/2011 |
| KR | 10 1269053 | B1 | 6/2013 |
| KR | 10-1974161 | B1 | 4/2019 |
| KR | 10-2221285 | B1 | 3/2021 |
| WO | 2010/014032 | A1 | 2/2010 |

OTHER PUBLICATIONS

Communication dated Jan. 9, 2025 issued by the Korean Intellectual Property Office in Korean Patent Application No. 10-2022-0082131.

Yong-Ho Ra et al., "Full-Color Single Nanowire Pixels for Projection Displays", Nano Letters, Jun. 22, 2016, 16(7), 25 pages.

Byung Oh Jung et al., "Emission Characteristics of InGaN/GaN Core-Shell Nanorods Embedded in a 3D Light-Emitting Diode", Nanoscale Research Letters, Apr. 22, 2016, 11:215, 10 pages, DOI 10.1186/s11671-016-1441-6.

* cited by examiner

LIGHT-EMITTING DEVICE, DISPLAY APPARATUS INCLUDING THE SAME, AND METHOD OF MANUFACTURING THE SAME

CROSS-REFERENCE TO RELATED APPLICATION

This application is based on and claims priority under 35 U.S.C. § 119 to Korean Patent Application No. 10-2022-0082131, filed on Jul. 4, 2022, in the Korean Intellectual Property Office, the disclosure of which is incorporated by reference herein in its entirety.

BACKGROUND

1. Field

The disclosure relates to a light-emitting device, a display apparatus including the same, and a method of manufacturing the same.

2. Description of the Related Art

A light-emitting device is known as a next-generation light source that has a greater lifespan and lower power consumption than previous light sources while having a fast response and being environmentally friendly. Light-emitting devices such as these have been used in various products, such as in an illumination device, and a backlight unit of a display apparatus. In particular, a light-emitting diode (LED) based on Group III nitrides, such as gallium nitride (GaN), aluminum gallium nitride (AlGaN), indium gallium nitride (InGaN), and indium aluminum gallium nitride (InAlGaN), has served as a semiconductor light-emitting device for emitting light.

A rod light-emitting device having a length greater than a width has a higher light extraction efficiency than a light-emitting device of a thin-film light emitting device. However, because it is difficult to manufacture an electrode structure for applying currents to a large quantity of rod light-emitting devices, and also, it is difficult to transfer the rod light-emitting device to a layer including a driving circuit, commercialization of the rod light-emitting devices is difficult.

SUMMARY

A light-emitting device may include a plurality of light-emitting rods. Each of the plurality of light-emitting rods may include a first semiconductor layer having a rod shape, an active layer having a shell shape disposed about a plurality of surfaces of the first semiconductor layer, and a second semiconductor layer having a shell shape disposed about a plurality of surfaces of the active layer. The light emitting device may further include an insulating layer disposed in spaces between the plurality of light-emitting rods; a transparent electrode electrically connected to the first semiconductor layer of each of the plurality of light-emitting rods; and a reflective electrode electrically connected to the second semiconductor layer of each of the plurality of light-emitting rods.

A thickness of the reflective electrode may be greater than a thickness of the transparent electrode.

A thickness of the reflective electrode may greater than or equal to 100 nm, and a thickness of the transparent electrode may be greater than or equal to 10 nm and less than 100 nm.

The first semiconductor layer of each of the plurality of light-emitting rods may coplanarly contact the transparent electrode. A portion of the second semiconductor layer of each of the plurality of light-emitting rods may be embedded in the reflective electrode.

The first semiconductor layer may include a portion protruding from the active layer and the second semiconductor layer.

The insulating layer may include: a first insulating layer in contact with a side surface of the first semiconductor layer; and a second insulating layer in contact with a side surface of the second semiconductor layer.

The light-emitting device may further include a common semiconductor layer in contact with the first semiconductor layer of each of the plurality of light-emitting rods. The transparent electrode may be electrically connected to the first semiconductor layer of each of the plurality of light-emitting rods, through the common semiconductor layer.

The plurality of light-emitting rods may include a first light-emitting rod and a second light-emitting rod. The first light-emitting rod and the second light-emitting rod may be configured to emit light at different wavelengths from each other.

The first light-emitting rod and the second light-emitting rod may have different contents of indium from each other.

A width of the first light-emitting rod may be greater than a width of the second light-emitting rod.

The first light-emitting rod may be configured to emit light at a greater wavelength than the second light-emitting rod.

A display apparatus may include: a substrate; and a display device layer arranged on the substrate. The display device may include a plurality of light-emitting devices. At least one of the plurality of light-emitting devices may include: a reflective electrode arranged on the substrate; a transparent electrode arranged to be apart from the reflective electrode in a thickness direction of the substrate; and a plurality of light-emitting rods arranged between the reflective electrode and the transparent electrode. Each of the plurality of light-emitting rods may include: a first semiconductor layer having a rod shape, an active layer having a shell shape disposed about a plurality of surfaces of the first semiconductor layer, and a second semiconductor layer having a shell shape disposed about a plurality of surfaces of the active layer.

A thickness of the reflective electrode may be greater than a thickness of the transparent electrode.

A thickness of the reflective electrode may be greater than or equal to 100 nm, and a thickness of the transparent electrode is greater than or equal to 10 nm and less than 100 nm.

The first semiconductor layer of each of the plurality of light-emitting rods may coplanarly contact the transparent electrode. A portion of the second semiconductor layer of each of the plurality of light-emitting rods may be embedded in the reflective electrode.

The display apparatus may further include: a first insulating layer in contact with a side surface of the first semiconductor layer; and a second insulating layer in contact with a side surface of the second semiconductor layer.

The display apparatus may further include a common semiconductor layer in contact with the first semiconductor layer of each of the plurality of light-emitting rods. The transparent electrode is electrically connected to the first semiconductor layer of each of the plurality of light-emitting rods through the common semiconductor layer.

The substrate may include a driving layer comprising a transistor configured to drive the plurality of light-emitting devices.

The plurality of light-emitting rods may include a first light-emitting rod and a second light-emitting rod. The first light-emitting rod and the second light-emitting rod may be configured to emit light at different wavelengths from each other.

A width of the first light-emitting rod may be greater than a width of the second light-emitting rod.

The first light-emitting rod may be configured to emit light at a greater wavelength than the second light-emitting rod.

The plurality of light-emitting devices may include: a first light-emitting device including a plurality of third light-emitting rods having a first width; a second light-emitting device including a plurality of fourth light-emitting rods having a second width that is less than the first width; and a third light-emitting device including a plurality of fifth light-emitting rods having a third width that is less than the second width.

The plurality of third light-emitting rods, the plurality of fourth light-emitting rods, and the plurality of fifth light-emitting rods may include indium contents that are different from each other.

The plurality of third light-emitting rods, the plurality of fourth light-emitting rods, and the plurality of fifth light-emitting rods may be configured to emit light at different wavelengths from each other.

The display apparatus may further include a color-conversion layer configured to convert light incident from the display device layer into light having a predetermined wavelength.

A method of manufacturing a display apparatus may include: forming, on a base layer, a membrane comprising a plurality of cavities; forming, on the membrane, a nitride semiconductor layer; forming, on the nitride semiconductor layer, a mask layer including a plurality of openings; forming, on the nitride semiconductor layer, a plurality of light-emitting rods each having a core-shell structure comprising a first semiconductor layer, an active layer, and a second semiconductor layer, by using the plurality of openings; forming a second insulating layer disposed in spaces between the plurality of light-emitting rods; forming a reflective electrode in contact with the second insulating layer and the second semiconductor layer of each of the plurality of light-emitting rods; bonding the reflective electrode on a substrate; removing the base layer, the membrane, the nitride semiconductor layer, and the mask layer from the plurality of light-emitting rods; forming a first insulating layer in contact with the first semiconductor layer of each of the plurality of light-emitting rods; and forming a transparent electrode in contact with the first semiconductor layer of each of the plurality of light-emitting rods.

The substrate may include a plurality of transistors configured to drive the plurality of light-emitting rods.

The reflective electrode may be bonded to the substrate by eutectic bonding.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
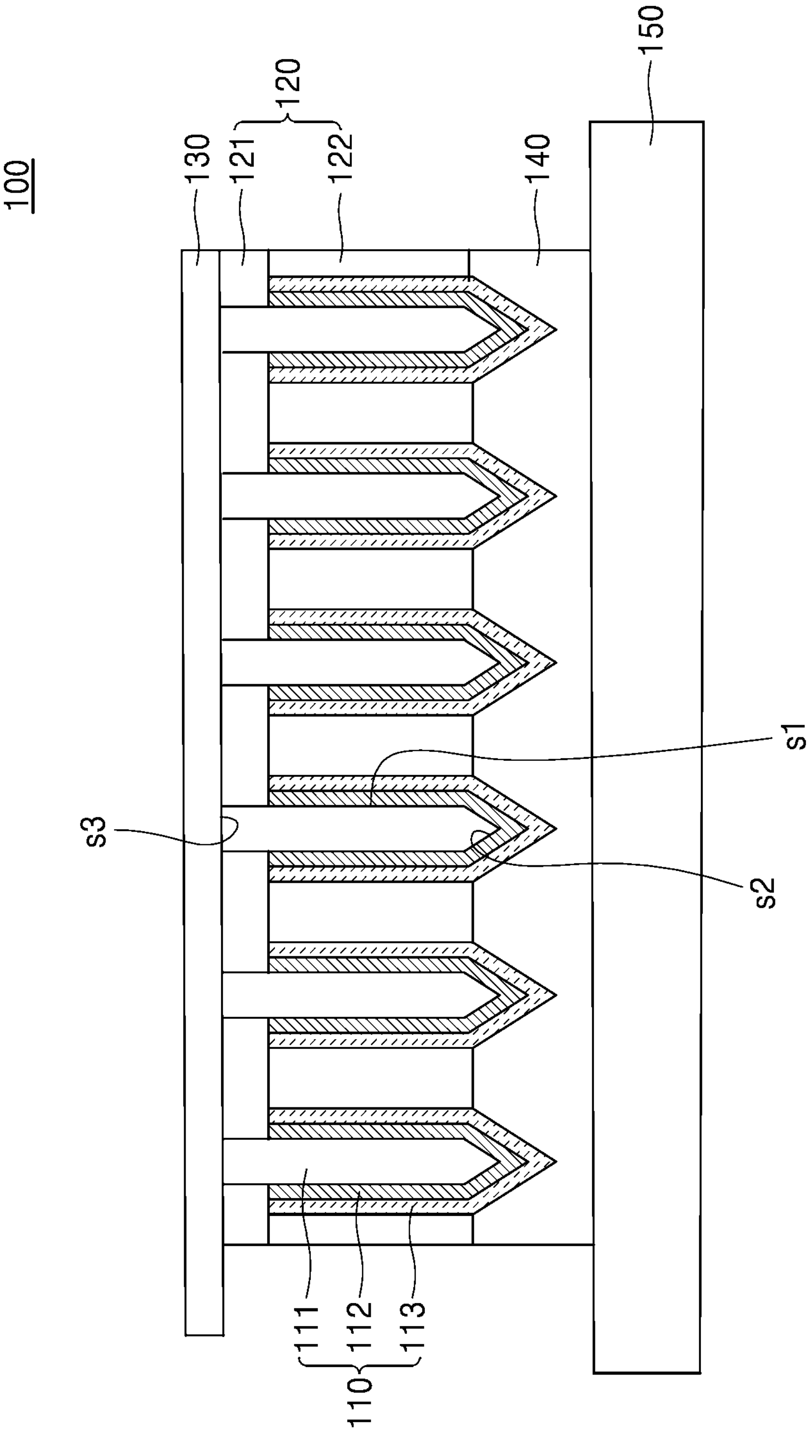
FIG. 1 is a view of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail by referring to the accompanying drawings. The embodiments described hereinafter are only examples, and various modifications may be made based on the embodiments. In the drawings, the same reference numerals denote the same elements and sizes of elements may be exaggerated for clarity and convenience of explanation.

Hereinafter, it will be understood that when an element is referred to as being "on" or "above" another element, the element can be directly over or under the other element and directly on the left or on the right of the other element, or intervening elements may also be present therebetween.

Although the terms "first," "second," etc. may be used herein to describe various elements, these terms are only used to distinguish one element from another. These terms are not used to define differences of materials or structures between the elements.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

Also, the terms such as ". . . unit," "module," or the like used in the specification indicate a unit, which processes at least one function or motion, and the unit may be implemented by hardware or software, or by a combination of hardware and software.

Particular executions described in the embodiments are examples and do not limit the technical scope by any means. For the sake of brevity, conventional electronics, control systems, software development and other functional aspects of the systems may not be described. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The term "the" and other equivalent determiners may correspond to a singular referent or a plural referent.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are not defined in the scope of the claims.

FIG. 1 is a view of a light-emitting device 100 according to an embodiment. Referring to FIG. 1, the light-emitting device 100 may include a plurality of light-emitting rods 110 arranged to be apart from each other, an insulating layer 120 filling spaces between the plurality of light-emitting rods 110, a transparent electrode 130 arranged above the plurality of light-emitting rods 110, and a reflective electrode 140 arranged below the plurality of light-emitting rods 110. As an example, FIG. 1 illustrates six light-emitting rods 110. However, the embodiments are not limited thereto. The number of light-emitting rods 110 may be determined according to a usage of the light-emitting device 100. An average length of each of the light-emitting rods 110 may be greater than an average width of each of the light-emitting rods 110. However, the embodiments are not limited thereto. The average length of the light-emitting rod 110 may be substantially the same as or less than the average width of the light-emitting rod 110.

The light-emitting device 110 may further include a substrate 150 supporting the plurality of light-emitting rods 110. Since the reflective electrode 140, the plurality of light-emitting rods 110, and the transparent electrode 130 may be sequentially arranged in a thickness direction of the substrate 150, the light-emitting device 100 may be referred to as a vertical light-emitting device.

Each of the plurality of light-emitting rods 110 may have a core-shell structure. As used in this disclosure, the phrase "core-shell structure" denotes a structure in which an exterior shell surrounds an interior core. In some embodiments, the light-emitting rod 110 may have a core-shell structure in which a portion of the core (for example, an upper surface of the core) is open, rather than being covered by the shell.

The light-emitting rod 110 may include a first semiconductor layer 111, an active layer 112, and a second semiconductor layer 113.

The first semiconductor layer 111 may include, for example, an n-type semiconductor. However, embodiments are not necessarily limited thereto, and according to cases, the first semiconductor layer 111 may include a p-type semiconductor. For example, the first semiconductor layer 111 may include Groups III-V based n-type semiconductors (e.g., an n-type nitride semiconductor). Here, the nitride semiconductor may include, for example, gallium nitride (GaN), indium nitride (InN), aluminum nitride (AlN), or a combination thereof, but is not limited thereto. For example, the first semiconductor layer 111 may include n-GaN.

The first semiconductor layer 111 may correspond to the core of the core-shell structure and may have a three-dimensional shape having a relatively greater thickness than the active layer 112 and the second semiconductor layer 113. The first semiconductor layer 111 may have a rod shape having a length greater than a width. A side surface s1 of the first semiconductor layer 111 may be a non-polar surface, such as an m-plane or an a-plane. A slope surface s2 of the first semiconductor layer 111 may be a semi-polar surface, such as an s-plane. A planar surface s3 (or referred to as an "open surface") of the first semiconductor layer 111 may be a polar surface such as a c-plane. The active layer 112 described below may be formed on the semi-polar surface or the non-polar surface of the first semiconductor layer 111 and may not be formed on the polar surface of the first semiconductor layer 111, and thus, may have an excellent emission property.

A cross-section of the first semiconductor layer 111 may have a circular shape, an oval shape, or a polygonal shape, such as a triangular shape. The width of the first semiconductor layer 111 may be determined according to a wavelength of light emitted by the light-emitting rod 110. For example, the width of the first semiconductor layer 111 may be greater than or equal to about 40 nm and less than or equal to about 4000 nm. A length of the first semiconductor layer 111 may be greater than or equal to about 50 nm and less than or equal to about 5000 nm.

The active layer 112 and the second semiconductor layer 113 may correspond to the shell of the core-shell structure and may have relatively less thicknesses than the first semiconductor layer 111. The active layer 112 may surround the plurality of surfaces of the first semiconductor layer 111 having the three-dimensional shape. For example, the active layer 112 may be provided to cover the slope surface s2 and the side surface s1 of the first semiconductor layer 111.

The active layer 112 may emit light of a predetermined wavelength band as electrons and holes combine with each other. The active layer 112 may have a multi-quantum well (MQW) structure. However, embodiments are not necessarily limited thereto. For example, the active layer 112 may have a single-quantum well (SQW) structure. The active layer 112 may include Groups III-V-based semiconductors (e.g., a GaN semiconductor). For example, the active layer 112 may include GaN.

The second semiconductor layer 113 may be provided to cover the active layer 112. The second semiconductor layer 113 may have a shell shape surrounding a plurality of surfaces of the active layer 112. For example, the second semiconductor layer 113 may be provided to cover a slope surface and a side surface of the active layer 112. Accordingly, the upper surface of the first semiconductor layer 111 may not be covered by the active layer 112 and the second semiconductor layer 113 and may be open.

The second semiconductor layer 113 may include, for example, a p-type semiconductor. However, an embodiment is not necessarily limited thereto, and according to cases, the second semiconductor layer 113 may include an n-type semiconductor. The second semiconductor layer 113 may include Groups III-V-based p-type semiconductors, for example, a p-type nitride semiconductor. For example, the second semiconductor layer 113 may include p-GaN.

The insulating layer 120 may be arranged between the light-emitting rods 110. The insulating layer 120 may maintain a distance between the light-emitting rods 110 to be constant and protect the light-emitting rods 110. The insulating layer 120 may include a first insulating layer 121 contacting the side surface s1 of the first semiconductor layer 111 and a second insulating layer 122 contacting a side surface of the second semiconductor layer 113. An upper surface of the first insulating layer 121 may be coplanarly arranged with the upper surface of the first semiconductor layer 111 of the light-emitting rods 110. A portion of each of the light-emitting rods 110 may downwardly protrude with respect to a lower surface of the second insulating layer 122.

The insulating layer 120 may include a transparent insulating material. The insulating layer 120 may fill the spaces between the light-emitting rods 110 by using a spin coating method, and thus, the insulating layer 120 may include an organic material, such as a photoresist, but is not limited thereto.

The transparent electrode 130 may be electrically connected with the first semiconductor layer 111. For example, the transparent electrode 130 may be arranged on the upper surface of the first semiconductor layer 111 and the upper surface of the first insulating layer 121. The first semiconductor layer 111 included in each of the light-emitting rods 110 may coplanarly contact the transparent electrode 130.

When the first semiconductor layer 111 includes, for example, an n-type nitride semiconductor, the transparent electrode 130 may be an n-type electrode. The transparent electrode 130 may include, for example, a transparent conductive material, such as indium tin oxide (ITO) and indium zinc oxide (IZO). However, embodiments are not limited thereto. The transparent electrode 130 and the first semiconductor layer 111 may form an ohmic contact. A light transmittance of the transparent electrode 130 may be greater than or equal to 80%.

The reflective electrode 140 may be provided to be electrically connected with the second semiconductor layer 113. In detail, the reflective electrode 140 may contact a portion of the second semiconductor layer 113, without being covered by an open surface of the second semiconductor layer 113, that is, the second insulating layer 122.

When the second semiconductor layer 113 includes, for example, a p-type nitride semiconductor, the reflective electrode 140 may be a p-type electrode. The reflective electrode 140 may include a metal material having an excellent conductive property. For example, the reflective electrode 140 may include at least one of Au, Ag, Cu, Zn, Al, In, Ti, Si, Ge, Sn, Mg, Ta, Cr, W, Ru, Rh, Ir, Ni, Pd, and Pt. A light transmittance of the reflective electrode 140 may be greater than or equal to 80%.

A portion of the second semiconductor layer 113 may be embedded in the reflective electrode 140 and may increase a contact area between the second semiconductor layer 113 and the reflective layer 140. In general, due to a low hole mobility between a p-type semiconductor layer and the reflective electrode 140, current spreading may not be smooth. A portion of the second semiconductor layer 113 according to an embodiment may be embedded in the reflective electrode 140 to increase a contact area therebetween. Thus, current spreading may be improved.

The transparent electrode 130 may desirably have a little thickness. Also, since a portion of the second semiconductor layer 113 may be embedded in the reflective electrode 140, a thickness of the reflective electrode 140 may desirably correspond to a predetermined thickness. For example, a thickness of the reflective electrode 140 may be greater than a thickness of the transparent electrode 130. For example, the thickness of the reflective electrode 140 may be greater than or equal to about 100 nm. Also, the thickness of the transparent electrode 130 may be greater than or equal to about 10 nm and less than about 100 nm.

When a voltage is applied to each of the transparent electrode 130 and the reflective electrode 140 in the light-emitting device 100 having the structure described above, electrons and holes may combine with each other in the active layer 112 of the light-emitting rod 110, to generate light of a predetermined wavelength band, which is to be emitted to the outside of the light-emitting device 100. Here, a bandgap of the light-emitting rods 110 may be adjusted according to a type of material included in the light-emitting rods 110, so that the light-emitting rods 110 may emit light of a desired wavelength band. For example, the light-emitting device 100 may be implemented as a pixel of a display apparatus and may be configured to emit red, green, or blue light.

The light-emitting device 100 may have a micro-size. For example, the light-emitting device 100 may have, for example, a width less than or equal to about 100 μm×100 μm and a thickness less than or equal to about 10 μm. However, embodiments are not limited thereto. The size of the light-emitting device 100 may be easily adjusted by adjusting sizes and distances of the light-emitting rods 110.

Each of the light-emitting rods 110 included in the light-emitting device 100 may have a nano-size. For example, a width of the light-emitting rod 110 may be greater than or equal to about 100 nm and less than or equal to about 3500 nm. A distance between the light-emitting rods 110 may be greater than or equal to about 50 nm to less than or equal to about 1000 nm. Each light-emitting rod 110 may have a different width according to a wavelength of light emitted by each light-emitting rod 110.

The substrate 150 may include a semiconductor substrate. For example, the substrate 150 may include a Group IV semiconductor material, a Groups III/V semiconductor compound, or a Groups II/VI semiconductor compound. In detail, the substrate 150 may include at least one of Si, Ge, SiC, SiGe, SiGeC, or Ge, GaAs, InAs, and InP. However, it is only an example, and other various semiconductor materials may be included in the substrate 150.

The substrate 150 may include a single layer, or a plurality of layers in which different materials are stacked. The substrate 150 may include, for example, a silicon-on-insulator (SOI) substrate or a silicon germanium-on-insulator (SGOT) substrate. Also, the substrate 150 may include a non-doped semiconductor material or a doped semiconductor material.

The substrate 150 may include at least one semiconductor device (not shown). Here, the semiconductor device may include, for example, at least one of a transistor, a capacitor, a diode, and a resistor. However, embodiments are not limited thereto. When the light-emitting device 100 operates as a pixel of a display apparatus, the substrate 150 may be a display panel including a transistor.

The light-emitting device 100 according to an embodiment may include the light-emitting rods 110 having the core-shell structure, and thus, the active layer 112 may have an increased surface area, and surface recombination may be reduced. Thus, light extraction efficiency may be increased.

The light-emitting rods 110 according to an embodiment may be grown by a bottom-up method.

FIGS. 2 to 13 are reference views for describing a method of manufacturing the light-emitting device 100, according to an embodiment.

Figure 2:
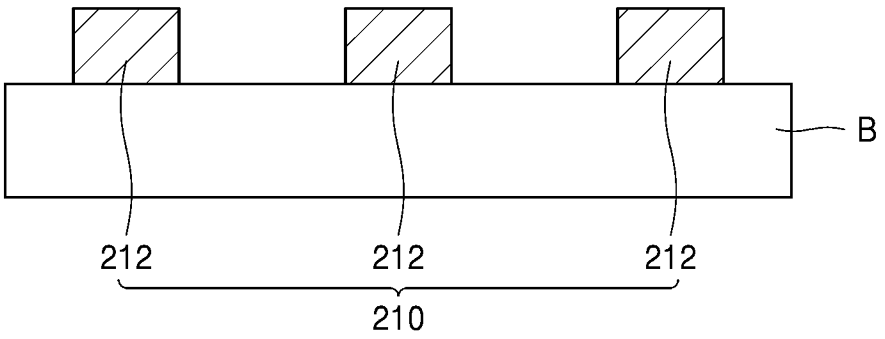
FIGS. 2 to 13 are reference views for describing a method of manufacturing a light-emitting device, according to an embodiment.

Referring to FIG. 2, a sacrificial layer pattern 210 including a plurality of sacrificial layers 212 may be formed on an upper surface of a base layer B. For example, FIG. 2 illustrates a case where the three sacrificial layers 212 are formed on the upper surface of the base layer B. Here, when the light-emitting rod 110 includes a nitride semiconductor, the base layer B may include, for example, a sapphire substrate, but is not limited thereto. The sacrificial layer pattern 210 may be formed to have various shapes by using, for example, a photolithography process, a nanoimprint process, or an organic nanoparticle bonding process.

Figure 3:
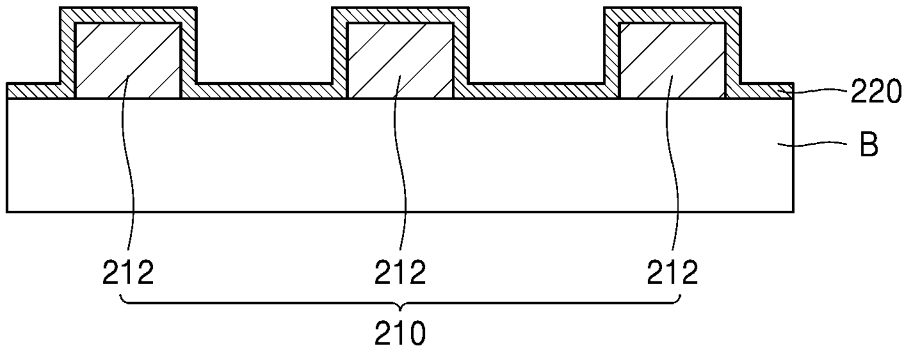

Referring to FIG. 3, a membrane material layer 220 may be formed on the upper surface of the base layer B to cover the sacrificial layer pattern 210. The membrane material layer 220 may be formed, for example, by atomic layer deposition (ALD), wet synthesis, oxidization after metal thin-film formation, or sputtering. In this case, the membrane material layer 220 may be formed to have an amorphous shape or a polycrystalline shape of fine particles. For example, when the base layer B includes a sapphire substrate, the membrane material layer 220 may include $Al_2O_3$.

Figure 4:
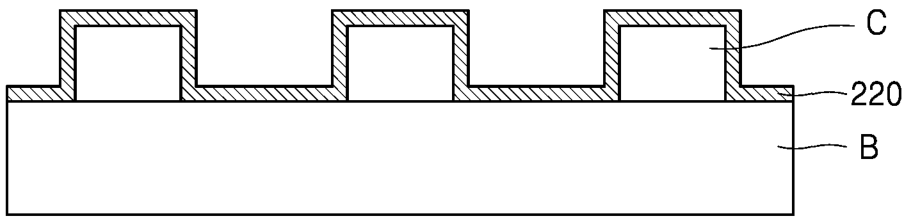

Referring to FIG. 4, the sacrificial layer pattern 210 may be selectively removed from the base layer B. When the sacrificial layer pattern 210 is removed, cavities C defined by the base layer B and the membrane material layer 420 may be formed.

Figure 5:
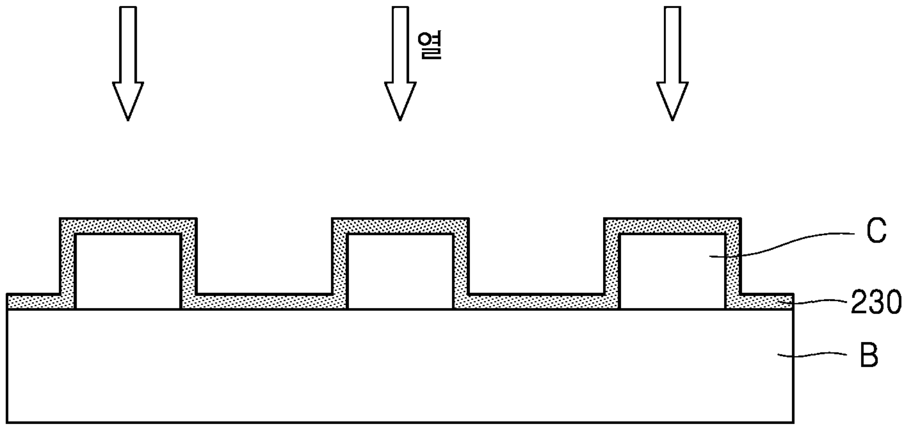

Referring to FIG. 5, after the sacrificial layer pattern 210 is removed, the membrane material layer 220 may be crystallized by heat treatment to form a membrane 230 corresponding to the cavities C. The membrane 230 formed by this crystallization process may have a polycrystalline shape or a monocystalline shape including large particles. Leg portions of the membrane 230 may be provided to contact the base layer B, at both sides of each of the cavities C.

Figure 6:
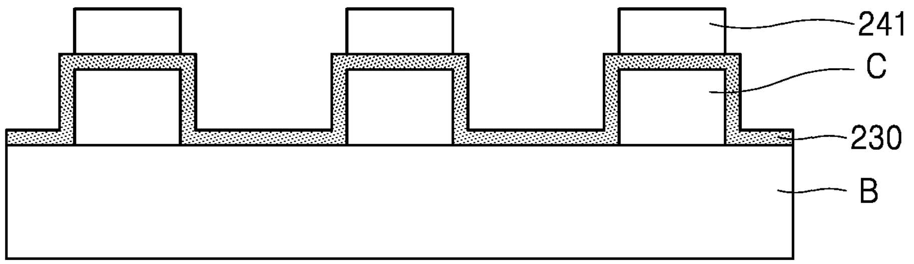
Figure 7:
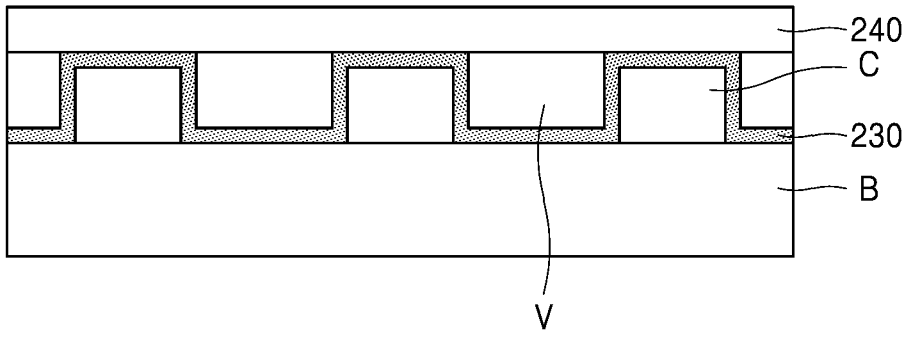

Referring to FIGS. 6 and 7, a nitride semiconductor layer 240 may be formed on the membrane 230 above the cavities C. The nitride semiconductor layer 240 may be formed as a multi-layer structure by including an appropriate buffer layer. The nitride semiconductor layer 240 may include all types of nitride semiconductor materials, such as GaN, InN, AlN, or a combination thereof, GaxAlyInzN ($0<x, y, z<1$). The nitride semiconductor layer 240 may not include a dopant.

The nitride semiconductor layer 240 may not be grown above the base layer B and may be grown above the membrane 230 above the cavities C. By adjusting a deposition temperature, pressure of gas, a fluid amount, etc., the nitride semiconductor layer 240 may be grown above the membrane 230 above the cavities C. Grown portions 241 may be combined to form the nitride semiconductor layer 240, and a void V may be formed between the cavities C. The nitride semiconductor layer 240 according to an embodiment may share stress with the membrane 230, and thus, the nitride semiconductor layer 240 may have high quality with a less defect density.

Figure 8:
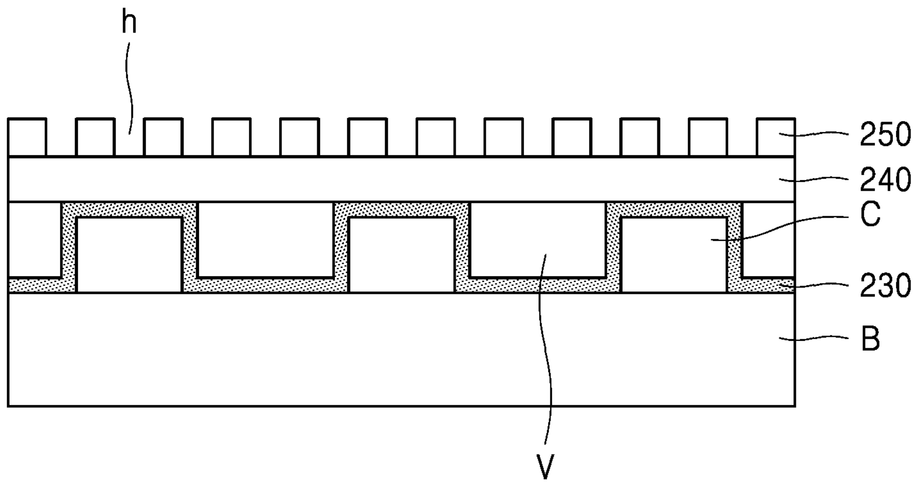

Referring to FIG. 8, a mask layer 250 including a plurality of holes h may be formed on the nitride semiconductor layer 240. The mask layer 250 may have a mesh structure including the plurality of holes h. For example, after an insulating material layer is formed on the nitride semiconductor layer 240, the holes h may be patterned. Sizes of the holes h may be greater than or equal to about 50 nm and less than or equal to about 4000 nm, and shapes of the holes h may be circular, oval, and/or polygonal. The plurality of holes h may be one-dimensionally or two-dimensionally arranged and may have the same sizes as each other or different sizes from each other. The shape, width, etc. of the hole h may determine the shape, width, etc. of the first semiconductor layer 111 that is subsequently formed.

Figure 9:
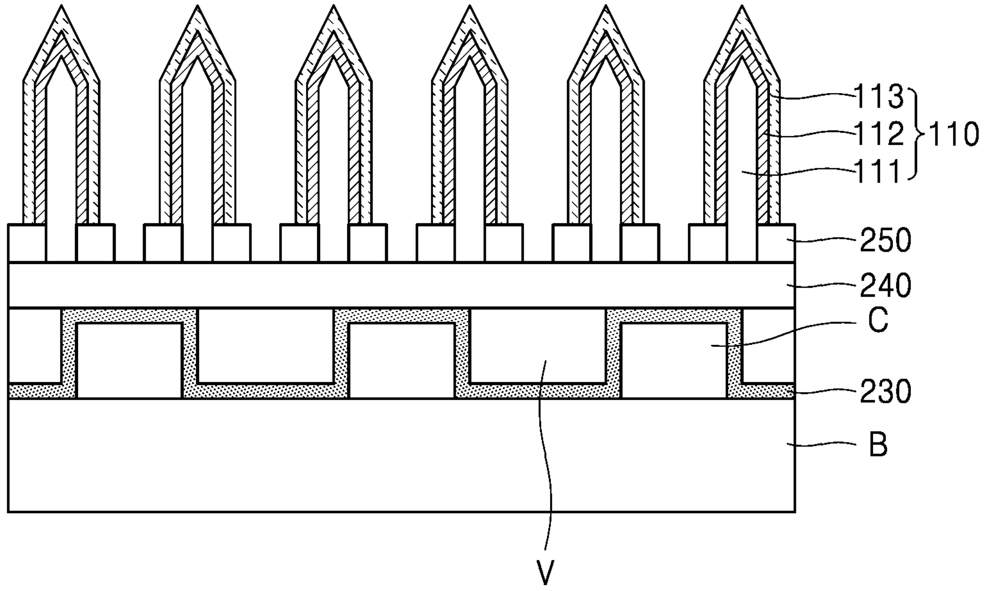

Referring to FIG. 9, the first semiconductor layer 111 may be grown on the nitride semiconductor layer 240 exposed through the hole h, and the active layer 112 and the second semiconductor layer 113 may be sequentially grown on the first semiconductor layer 111 to form the light-emitting rod 110. For example, the first semiconductor layer 111 may be grown on the nitride semiconductor layer 240 exposed through the hole h. The first semiconductor layer 111 may have a rod shape having the same cross-section as the hole h. The active layer 112 may be grown to cover a surface of the first semiconductor layer 111, the surface being exposed by the mask layer 250, and the second semiconductor layer 113 may be grown to cover an exposed surface of the active layer 112. The first semiconductor layer 111, the active layer 112, and the second semiconductor layer 113 may be grown by metal organic chemical vapor deposition (MOCVD), but embodiments are not limited thereto.

Each of the light-emitting rods 110 may be formed to have a core-shell structure. In this case, the first semiconductor layer 111 may form a core of the core-shell structure, and the active layer 112 and the second semiconductor layer 113 may form a shell of the core-shell structure. The first semiconductor layer 111, the active layer 112, and the second semiconductor layer 113 included in the light-emitting rod 110 may include, for example, nitride semiconductors. A bandgap of the light-emitting rod 110 may be adjusted according to a type of material included in the light-emitting rod 110, so that the light-emitting rod 110 may emit light of a desired wavelength band.

Figure 10:
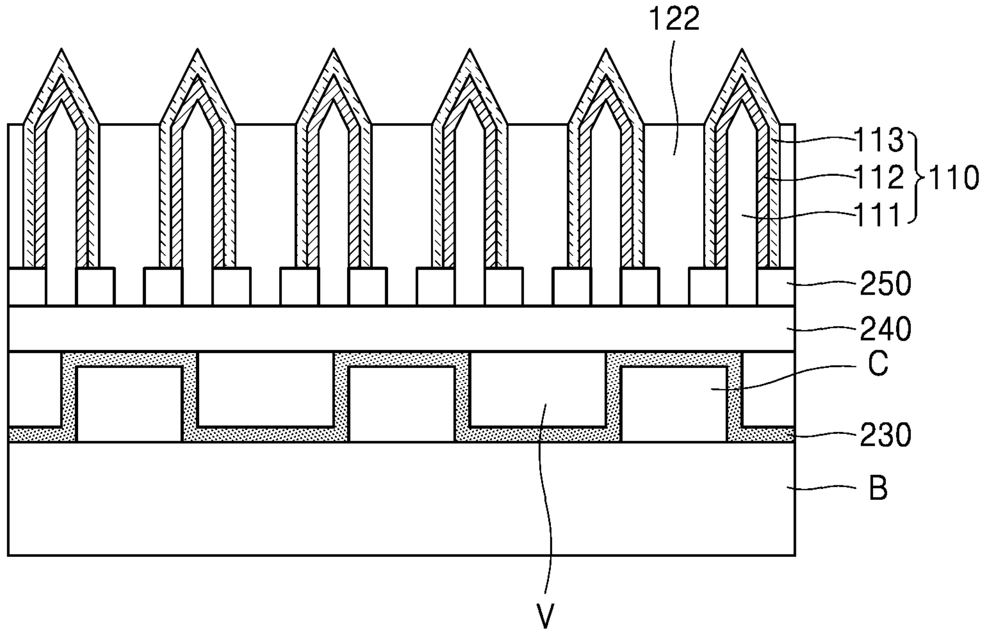

Referring to FIG. 10, the second insulating layer 122 may be formed to fill spaces between the plurality of light-emitting rods 110. The spaces between the light-emitting rods 110 may be small, and thus, the second insulating layer 122 may include an insulating material for spin coating. To increase the emission efficiency of the light-emitting rods 110, the second insulating layer 122 may include a transparent material. The second insulating layer 122 may be formed to expose a portion of the second semiconductor layer 113. The light-emitting rods 110 may be grown to be formed, and thus, an end of the light-emitting rod 110 may have an upwardly convex shape. Ends of the light-emitting rods 110 may be exposed to have a convex shape based on a surface of the second insulating layer 122.

Figure 11:
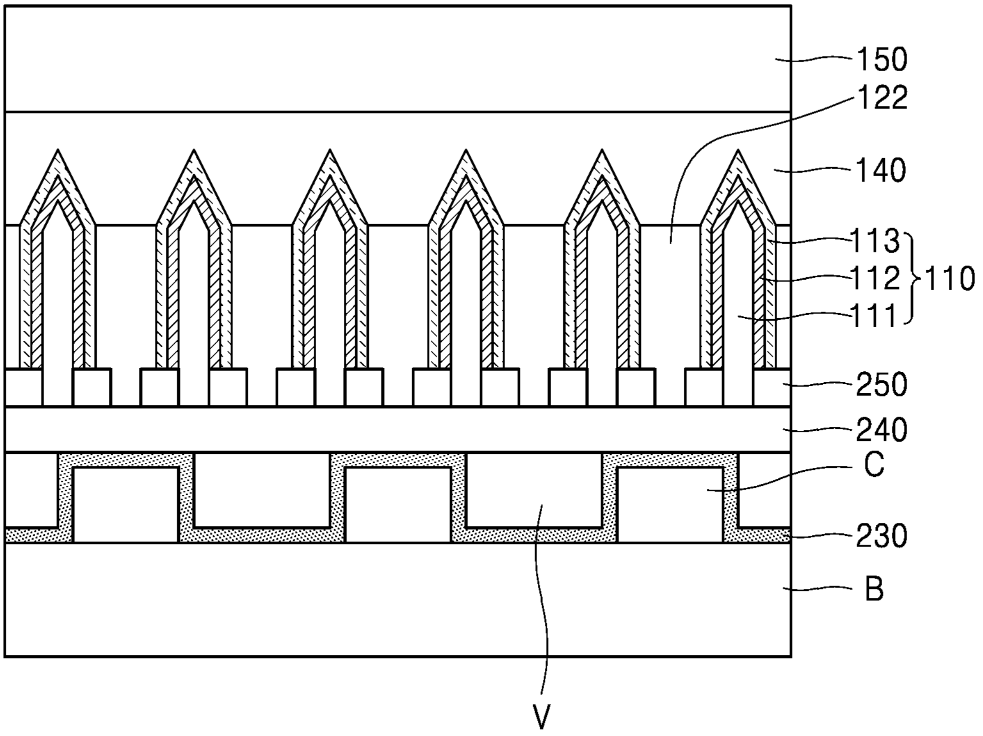

Referring to FIG. 11, the reflective electrode 140 may be formed on the plurality of light-emitting rods 110 and the second insulating layer 122. A portion of each of the light-emitting rods 110 may protrude from the second insulating layer 122, and thus, a portion of each of the light-emitting rods 110 may be embedded in the reflective electrode 140, when the reflective electrode 140 is formed.

When the second semiconductor layer 113 includes a p-type nitride semiconductor, the reflective electrode 140 may be a p-type electrode. The reflective electrode 140 may be formed by depositing a highly conductive metal material by using, for example, electron beam deposition.

Also, the substrate 150 may be bonded on the reflective electrode 140. Although not shown in FIG. 11, an electrode pattern may be formed on a surface of the substrate 150. The reflective electrode 140 may be bonded by eutectic bonding. For example, the reflective electrode 140 may be bonded on the substrate 150 by at least one of heat and pressure.

The substrate 150 may include a driving layer including a transistor (not shown) configured to drive, for example, the light-emitting device 100 and an electrode pattern. For example, the substrate 150 may be a display panel. As described above, the light-emitting device 100 may be formed in a process of manufacturing a display apparatus.

It is described that the substrate 150 may include the transistor configured to drive the light-emitting device 100, etc., but embodiments are not limited thereto. The substrate 150 may be a simply separate member on which a bonding layer is bonded. That is, the reflective electrode 140 may be bonded on the bonding layer of the substrate 150.

Figure 12:
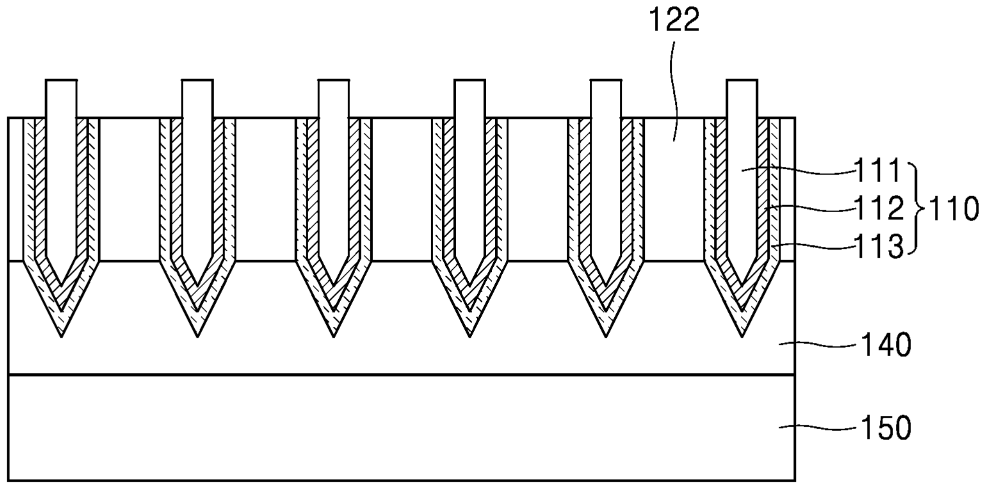

Referring to FIG. 12, the substrate 150, the membrane 230, the nitride semiconductor layer 240, and the mask layer 250 may be removed from the light-emitting rods 110.

The substrate 150 and the membrane 230 may be removed by mechanical lift off. The substrate 150 and the plurality of light-emitting rods 110 may be connected to each other by the membrane 230, with the cavities C and the void V between the substrate 150 and the plurality of light-emitting rods 110. The leg portions of the membrane 230 may be collapsed only by a small mechanical force, and thus, the light-emitting rods 110 may be easily separated from the substrate 150 without being damaged.

A remaining portion of the membrane 230, the nitride semiconductor layer 240, and the mask layer 250 may be additionally removed, to expose the first semiconductor layer 111 and the second insulating layer 122, as illustrated in FIG. 12. The remaining portion of the membrane 230, the nitride semiconductor layer 240, and the mask layer 250 may be removed by etching.

Figure 13:
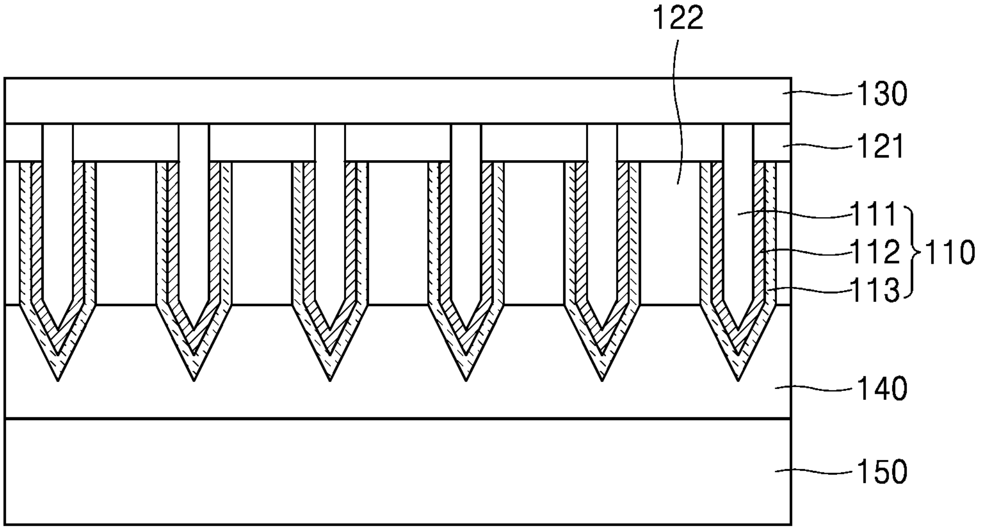

Referring to FIG. 13, the first insulating layer 121 may be formed on the second insulating layer 122. Due to the removal of the mask layer 250, a portion of the first semiconductor layer 111 may protrude from the active layer 112, the second semiconductor layer 113, and the second insulating layer 122. By forming the first insulating layer 121, the first semiconductor layer 111 and the first insulating layer 121 may have co-planar surfaces. The first insulating layer 121 and the second insulating layer 122 may include the same material as each other or different materials from each other. The second insulating layer 122 may include a transparent insulating material. The second insulating layer 122 may surround an exposed side surface of the first semiconductor layer 111 and may expose a surface of the first semiconductor layer 111.

Also, the transparent electrode 130 may be formed on the first semiconductor layer 111 and the second insulating layer 122 to form the light-emitting device 100. When the first semiconductor layer 111 includes an n-type nitride semiconductor, the transparent electrode 130 may be an n-type electrode. The transparent electrode 130 may be formed by depositing a transparent conductive material, such as ITO or IZO, on a lower surface of a protective layer by using, for example, electronic beam deposition. The light-emitting device 100 formed as described above may have a size that is less than or equal to 100 μm×100 μm and a thickness that is less than or equal to 10 μm. However, it is only an example.

In the light-emitting device 100 according to an embodiment, the light-emitting rods 110 may be grown by using a bottom-up method, by which the light-emitting rods 110 are selectively grown. Thus, when the light-emitting rods 110 are grown by the bottom-up method, less damage may occur to the light-emitting rods 110 than when the light-emitting rods 110 are grown by a top-down method, by which the light-emitting rods 110 are formed by etching. Therefore, the light-emitting rods 110 may have high light extraction efficiency.

The light-emitting rods 110 according to an embodiment may be grown on the membrane 230 crystallized and apart from the base layer B with the cavities C between the membrane 230 and the base layer B as described below, and thus, stress, which may occur in the light-emitting rods 110, may be reduced, and the light-emitting rods 110 may have a less defect density. Thus, the light-emitting device 100 may be realized to have high efficiency and reliability and increased light extraction efficiency.

The method of manufacturing one light-emitting device 100 is described with reference to FIGS. 2 to 13. However, embodiments are not limited thereto. A large quantity of light-emitting devices 100 may also be transferred on the substrate 150, for example, a display panel.

In FIG. 12, it is described that the second insulating layer 122 and the transparent electrode 130 may be formed after the nitride semiconductor layer 240 and the mask layer 250 are removed. However, embodiments are not limited thereto. The nitride semiconductor layer 240 and the mask layer 250 may also be included in the light-emitting device 100.

Figure 14:
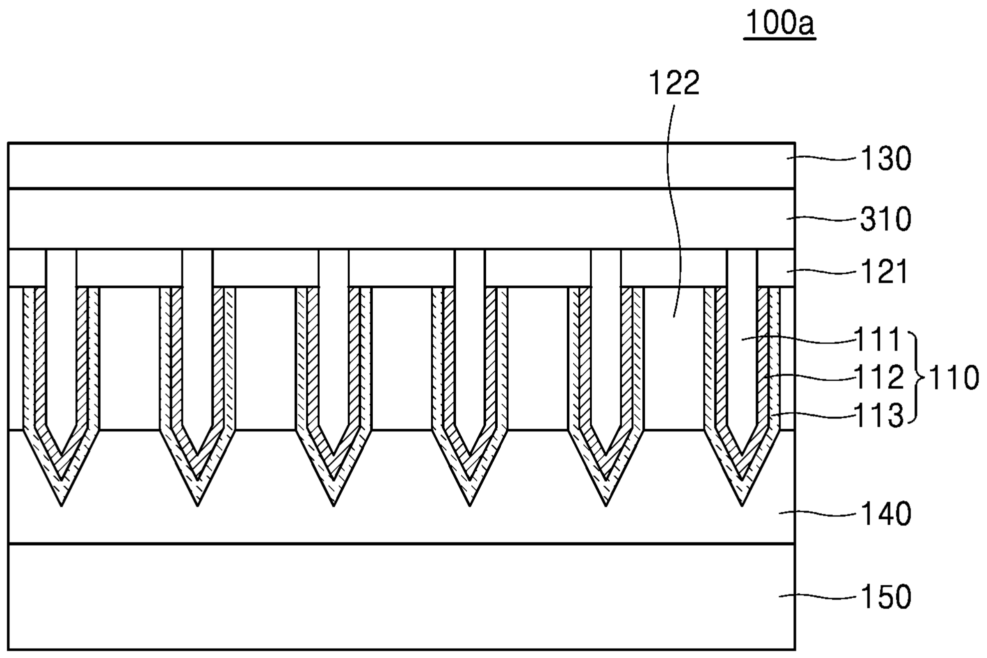
FIG. 14 is view of a light-emitting device including a common semiconductor layer, according to an embodiment.

FIG. 14 is a view of a light-emitting device **100*a* including a common semiconductor layer 310, according to an embodiment. Referring to FIGS. 1 and 14, the light-emitting device 100*a* of FIG. 14 may further include the common semiconductor layer 310 contacting the first semiconductor layer 111 of each of the light-emitting rods 110**.

The common semiconductor layer 310 may include the same material as the first semiconductor layer 111. For example, the common semiconductor layer 310 may include an n-type semiconductor. In detail, the common semiconductor layer 310 may include Groups III-V-based n-type semiconductors (e.g., an n-type nitride semiconductor). Here, the nitride semiconductor may include, for example, GaN, InN, AlN, or a combination thereof, but is not limited thereto.

The nitride semiconductor layer 240 as seen in FIG. 7 may be formed by including the same material as the first semiconductor layer 111 to become the common semiconductor layer 310 of FIG. 13. When the mask layer 250 formed in FIG. 8 is not removed, the mask layer 250 may become the second insulating layer 122. The transparent electrode 130 may be electrically connected to the common semiconductor layer 310, and thus, charges may be relatively more stably supplied to the active layer 112.

Although it is described that the common semiconductor layer 310 and the second insulating layer 122 may respectively correspond to the nitride semiconductor layer 240 and the mask layer 250 described in FIGS. 7 and 8, respectively, an embodiment is not limited thereto. It may also be possible that the second insulating layer 122 and the common semiconductor layer 310 may be formed by using additional materials, after removing the nitride semiconductor layer 240 and the mask layer 250 in FIG. 12.

It is described with reference to FIG. 9 that the light-emitting rods 110 may be grown on the nitride semiconductor layer 240. However, embodiments are not limited thereto, and the light-emitting rods 110 may be directly grown on the membrane 230.

FIGS. 15 to 19 are reference views for partially describing a method of manufacturing the light-emitting device 100, according to another embodiment.

Figure 15:
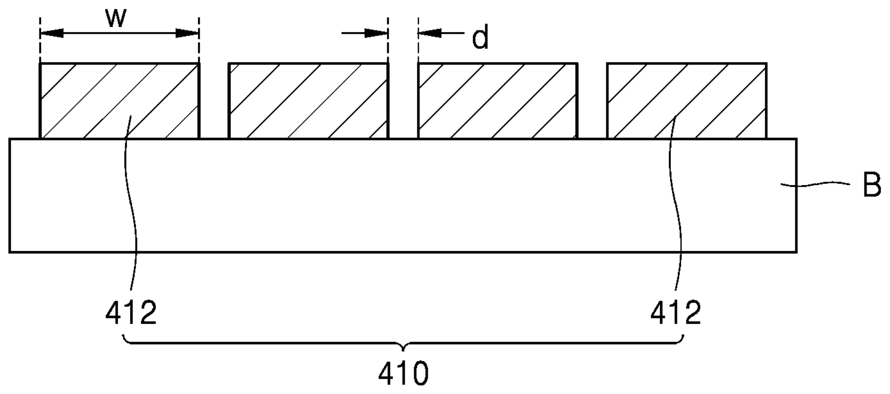
FIGS. 15 to 19 are reference views for partially describing a method of manufacturing a light-emitting device, according to another embodiment.

Referring to FIG. 15, a sacrificial layer pattern 410 may be formed on the base layer B. The sacrificial layer pattern 410 may include a plurality of sacrificial layers 412 apart from each other. A thickness and a width of the sacrificial layer pattern 410 may be ultimately determined by taking into account the cavities C to be formed. A distance d between the sacrificial layers 412 may be less than a width w of each of the sacrificial layers 412. For example, the distance d between the sacrificial layers 412 may be less than or equal to ½ of the width w of the sacrificial layer 412 or may be less than or equal to about 1 μm.

Figure 16:
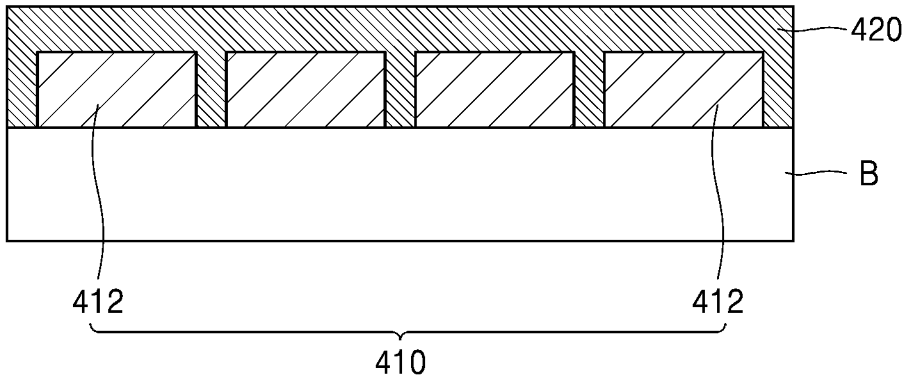

Referring to FIG. 16, a membrane material layer 420 may be formed on the sacrificial layer pattern 410 to cover the sacrificial layer pattern 410. When forming the membrane material layer 420, the distance d between the sacrificial layers 412 may be little, and thus, the membrane material layer 420 may fill the distance d between the sacrificial layers 412. While a height of an upper surface of the membrane material layer 220 of FIG. 3 may regularly change with respect to the base layer B, an upper surface of the membrane material layer 420 of FIG. 16 may maintain a constant distance with respect to the base layer B.

Figure 17:
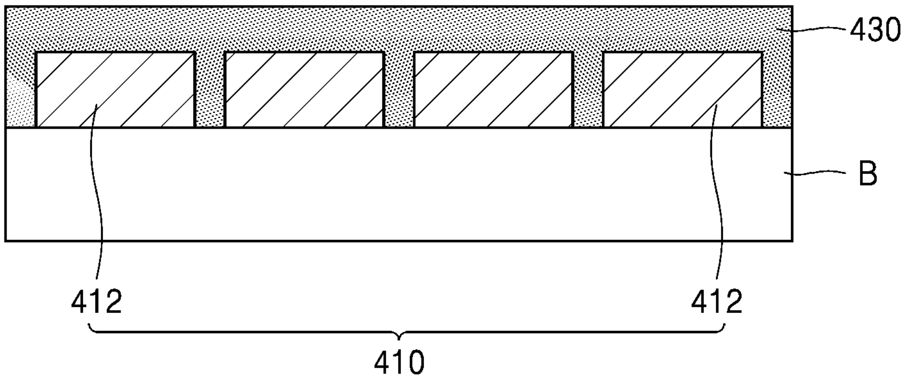

Referring to FIG. 17, the sacrificial layer pattern 410 may be removed, and the membrane material layer 420 may be crystallized to form a membrane 430. A method of removing the sacrificial layer pattern 410 and forming the membrane 430 is described above, and thus, its detailed description is omitted.

Figure 18:
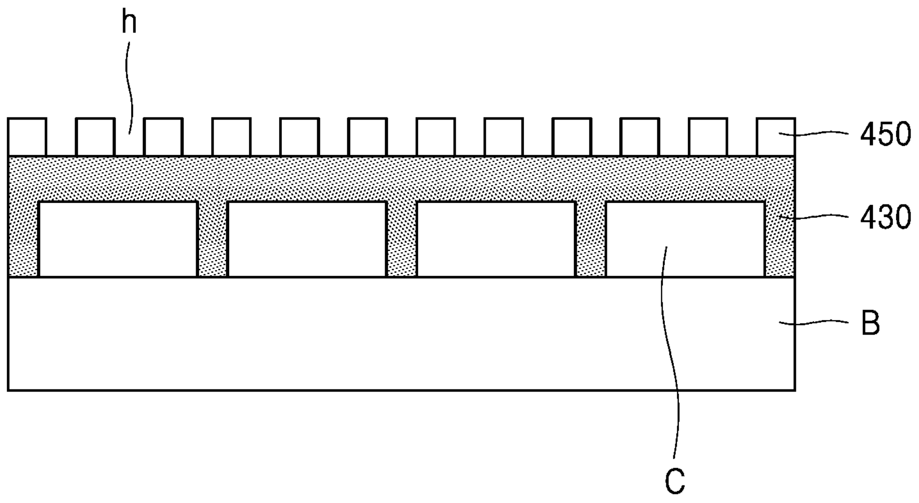

Referring to FIG. 18, a mask layer 450 including holes h may be formed on the crystallized membrane 430.

Figure 19:
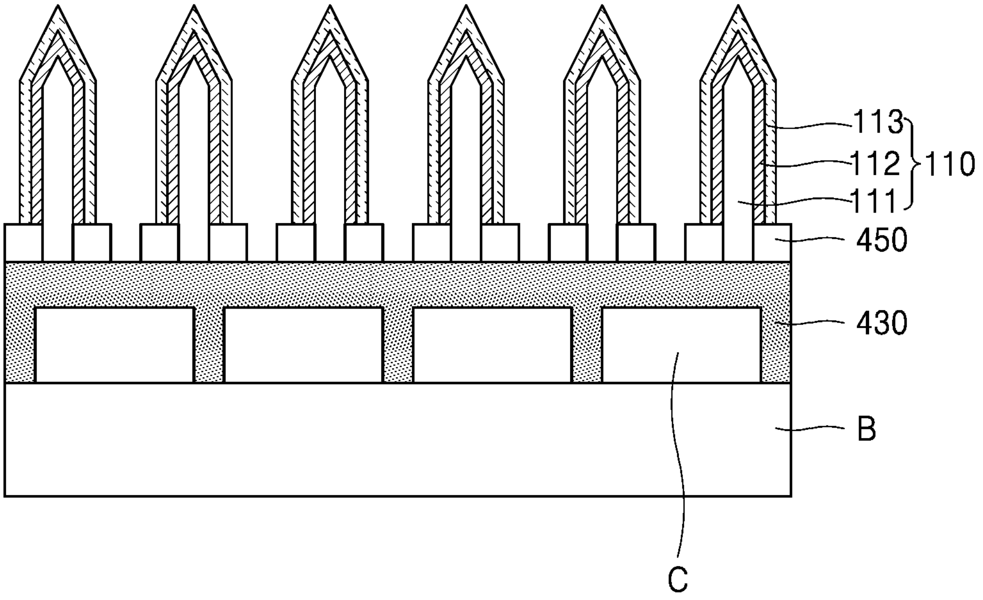

Referring to FIG. 19, the first semiconductor layer 111 may be directly grown on the membrane 430 through the holes h, the active layer 112 may be grown on the first semiconductor layer 111, and the second semiconductor layer 113 may be grown on the active layer 112, to form the light-emitting rod 110. By directly growing the first semiconductor layer 111 on the membrane 430, the process of removing the nitride semiconductor layer 240 as illustrated in FIG. 12 may be omitted. Subsequently, methods of forming the first insulating layer 122, the transparent electrode 130, and the reflective electrode 140 are the same as described above, and thus, their detailed descriptions are omitted.

The light-emitting rods 110 included in the light-emitting device 100 may emit light of the same wavelength. However, an embodiment is not limited thereto. At least one or more light-emitting rods from among the plurality of light-emitting rods 110 may emit light of different wavelengths. For example, the light-emitting device 100 may include a light-emitting rod emitting red light, a light-emitting rod emitting green light, and a light-emitting rod emitting blue light.

A wavelength of emitted light may vary depending on a content of a material included in the active layer 112 of the light-emitting rods 110. When the active layer 112 includes a nitride semiconductor, the wavelength of the emitted light may be increased, as a content of indium is increased. For example, when the content of indium of the active layer 112 is about 15%, the active layer 112 may emit blue light of about 450 nm, and when the content of indium of the active layer 112 is about 25%, the active layer 112 may emit green light of about 500 nm. Also, when the content of indium of the active layer 112 is about 30%, the active layer 112 may emit yellow light of about 560 nm, and when the content of indium of the active layer 112 is about 35%, the active layer 112 may emit red light of about 630 nm.

The content of indium of the active layer 112 may be adjusted by adjusting a width of the first semiconductor layer 111 included in the light-emitting rod 110. As the width of the first semiconductor layer 111 is decreased when forming the active layer 112, the content of indium of the active layer 112 formed per unit area of the first semiconductor layer 111 may be increased. As the content of indium is increased, the active layer 112 may emit light of an increased wavelength. Thus, the wavelength of light emitted by the light-emitting rods 110 according to an embodiment may be adjusted via the width of the first semiconductor layer 111.

Figure 20:
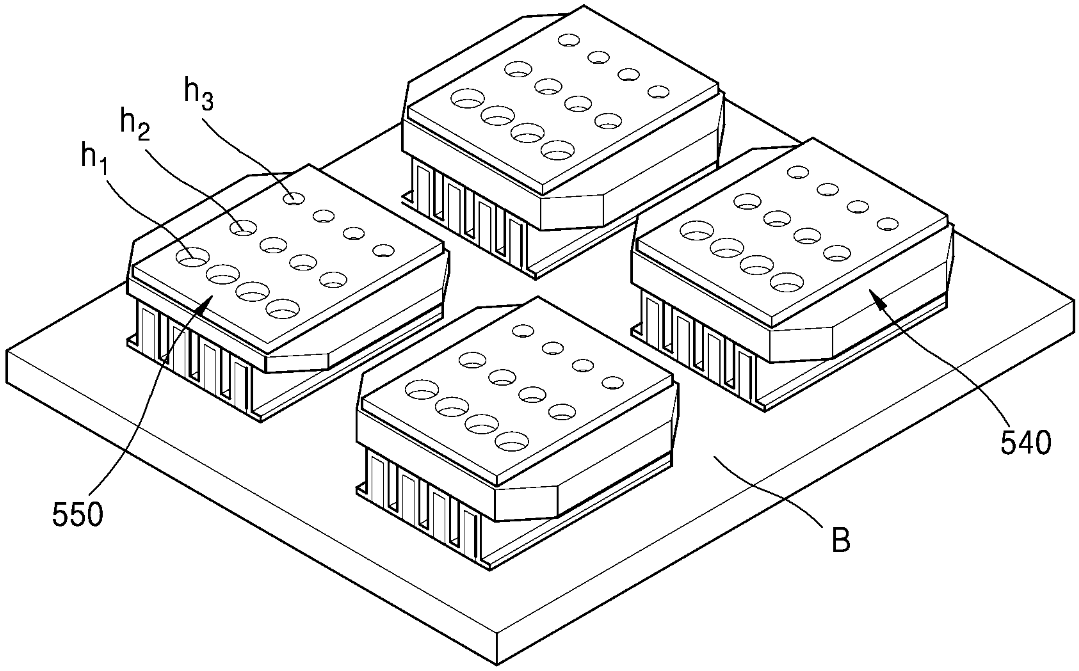
FIGS. 20 and 21 are views for partially describing a process of manufacturing a light-emitting device capable of emitting light having a plurality of wavelengths, according to an embodiment.
Figure 21:
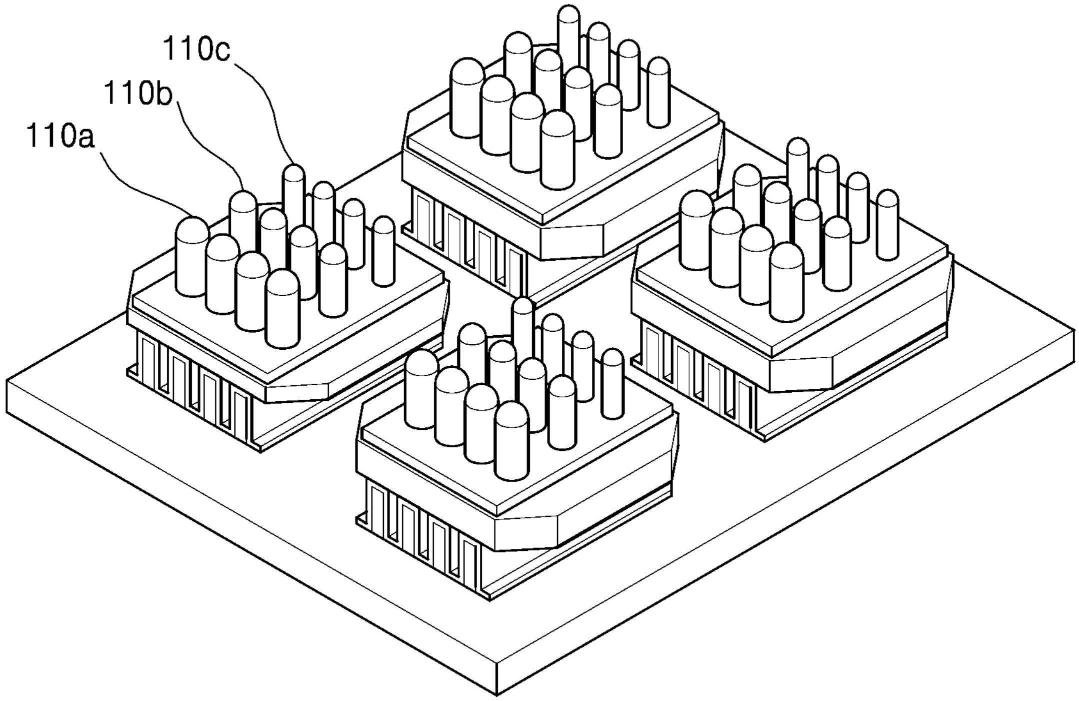

FIGS. 20 and 21 are views for partially describing a process of manufacturing a light-emitting device capable of emitting light having a plurality of wavelengths, according to an embodiment. Referring to FIG. 20, a mask layer 550 having a plurality of holes, that is, first to third holes h1, h2, and h3, may be formed on a nitride semiconductor layer 540. At least two holes from among the plurality of holes h1, h2, and h3 may have different sizes from each other. For example, the mask layer 550 may have the first hole h1 having a first width, the second hole h2 having a second width less than the first width, and the third hole h3 having a third width less than the second width. The first width may be greater than or equal to about 1500 nm and less than or equal to about 3500 nm, the second width may be greater than or equal to about 200 nm and less than or equal to about 1650 nm, and the third width may be greater than or equal to about 50 nm and less than or equal to about 300 nm.

The first semiconductor layer 111 may be formed on the nitride semiconductor layer 240 in each of the first to third holes h1, h2, and h3, and the active layer 112 and the second semiconductor layer 113 may be sequentially formed on the first semiconductor layer 111 to form the light-emitting rods **110*a*, 110*b*, and 110*c* as illustrated in FIG. 21. As illustrated in FIG. 21, the light-emitting rods 110*a*, 110*b*, and 110*c*** may include at least two light-emitting rods having different widths.

For example, the light-emitting rods **110*a*, 110*b*, and 110*c* may include a first light-emitting rod 110*a* formed in the first hole h1, a second light-emitting rod 110*b* formed in the second hole h2, and a third light-emitting rod 110*c* formed in the third hole h3. A width of the first light-emitting rod 110*a* may be greater than or equal to about 1600 nm and less than or equal to about 3800 nm, a width of the second light-emitting rod 110*b* may be greater than or equal to about 300 nm and less than or equal to about 1800 nm, and a width of the third light-emitting rod 110*c*** may be greater than or equal to about 50 nm and less than or equal to about 400 nm.

Light emitted by the second light-emitting rod **110*b* may have a wavelength greater than a wavelength of light emitted by the first light-emitting rod 110*a*, and light emitted by the third light-emitting rod 110*c* may have a wavelength greater than the wavelength of the light emitted by the second light-emitting rod 110*b*. For example, the first light-emitting rod 110*a* may emit blue light, the second light-emitting rod 110*b* may emit green light, and the third light-emitting rod 110*c* may emit red light. Thus, the light-emitting device manufactured by using the manufacturing process of FIG. 21** may emit white light.

Also, a plurality of light-emitting devices emitting light of different wavelengths may be manufactured on a single base layer. For example, the plurality of light-emitting devices which may operates as a pixel may be manufactured.

Figure 22:
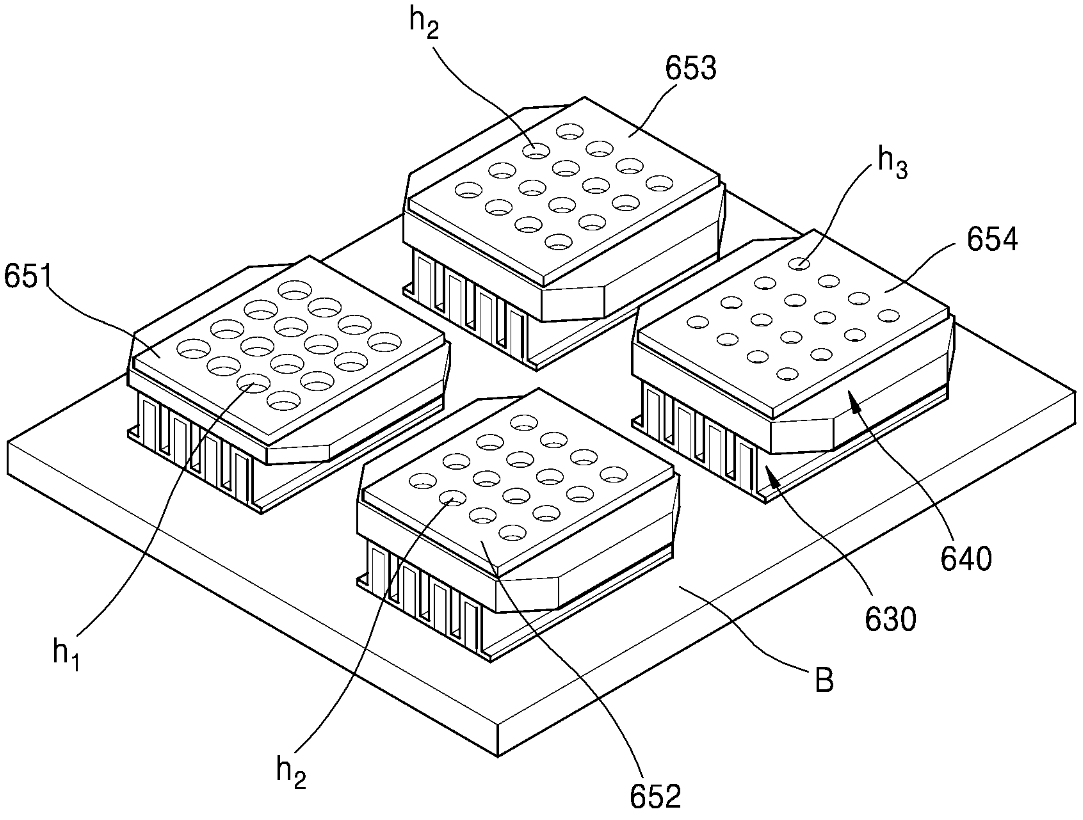
FIGS. 22 and 23 are views for partially describing a process of manufacturing a plurality of light-emitting devices capable of operating as a pixel, according to an embodiment.
Figure 23:
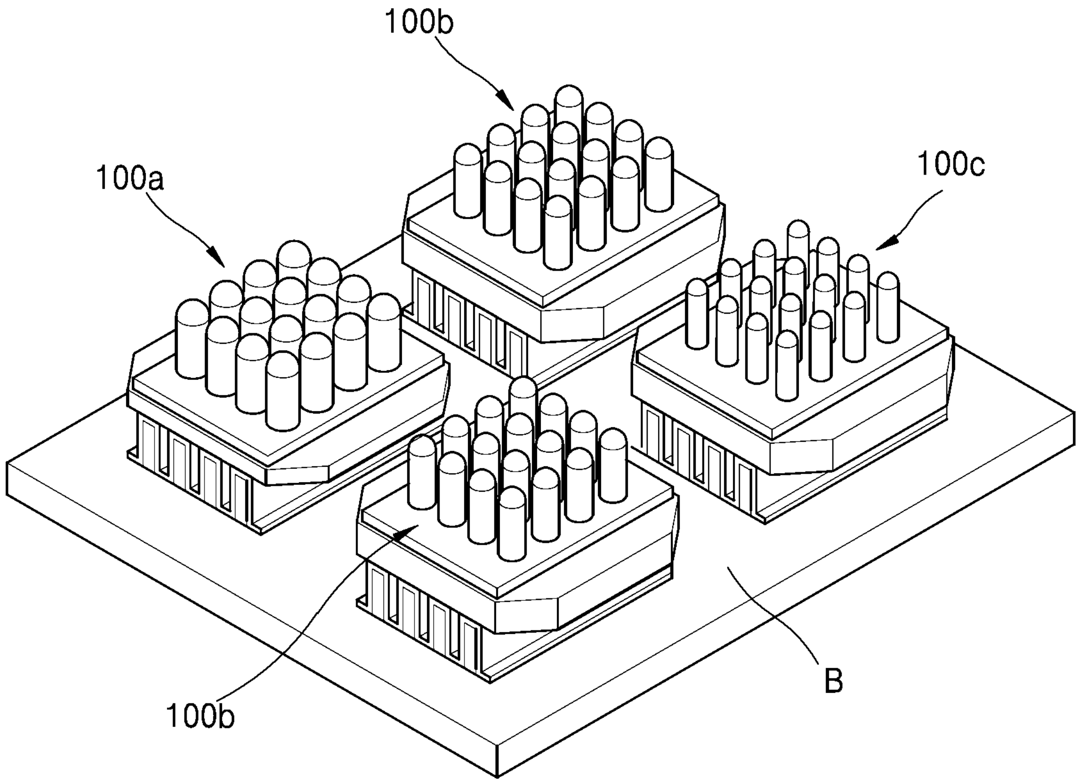

FIGS. 22 and 23 are views for partially describing a process of manufacturing the plurality of light-emitting devices 100 capable of operating as a pixel, according to an embodiment. Referring to FIG. 22, a plurality of membranes 630 arranged to be apart from each other may be formed on a base layer B. Also, a nitride semiconductor layer 640 may be formed on each of the membranes 630, and mask layers, namely, first to fourth mask layers 651, 652, 653, and 654, may be formed on the nitride semiconductor layer 640 of each membrane 630. Holes, namely, first to third holes h1, h2, and h3, having different widths from each other may be formed on the first to fourth mask layers 651, 652, 653, and 654. The first hole h1 having a first width may be formed in the first mask layer 651, the second hole h2 having a second width less than the first width may be formed in the second and third mask layers 652 and 653, and the third hole h3 having a third width less than the second width may be formed in the fourth mask layer 654. The first width may be greater than or equal to about 1500 nm and less than or equal to about 3500 nm, the second width may be greater than or equal to about 200 nm and less than or equal to about 1650 nm, and the third width may be greater than or equal to about 50 nm and less than or equal to about 300 nm.

The first semiconductor layer 111 may be formed on the nitride semiconductor layer 540 in each of the first to third holes h1, h2, and h3, and the active layer 112 and the second semiconductor layer 113 may be sequentially formed on the first semiconductor layer 111 to form the light-emitting rods 110*a*, 110*b*, and 110*c* as illustrated in FIG. 23. As illustrated in FIG. 23, light-emitting rods having different widths may be formed on at least two mask layers from among the first to fourth mask layers 651, 652, 653, and 654. The first light-emitting rods 110*a* having the greatest width may be formed on the first mask 651, the second light-emitting rods 110*b* having a middle width may be formed on the second and third mask layers 652 and 653, and the third light-emitting rods 110*c* having the least width may be formed on the fourth mask layer 654. The width of the first light-emitting rod 110*a* may be greater than or equal to about 1600 nm and less than or equal to about 3800 nm, the width of the second light-emitting rod 110*b* may be greater than or equal to about 300 nm and less than or equal to about 1800 nm, and the width of the third light-emitting rod 110*c* may be greater than or equal to about 50 nm and less than or equal to about 400 nm. Also, the first light-emitting rod 110*a* may emit blue light, the second light-emitting rod 110*b* may emit green light, and the third light-emitting rod 110*c* may emit red light. Thus, the light-emitting devices 100 manufactured by the manufacturing process of FIG. 23 may operate as a pixel in a display apparatus.

The plurality of light-emitting devices 100 which may operate as a pixel may be manufactured on one base layer by a single process. Also, the plurality of light-emitting devices 100 may be transferred to the substrate 150, for example, a display panel, and thus, it may become easy to manufacture a display apparatus.

Figure 24:
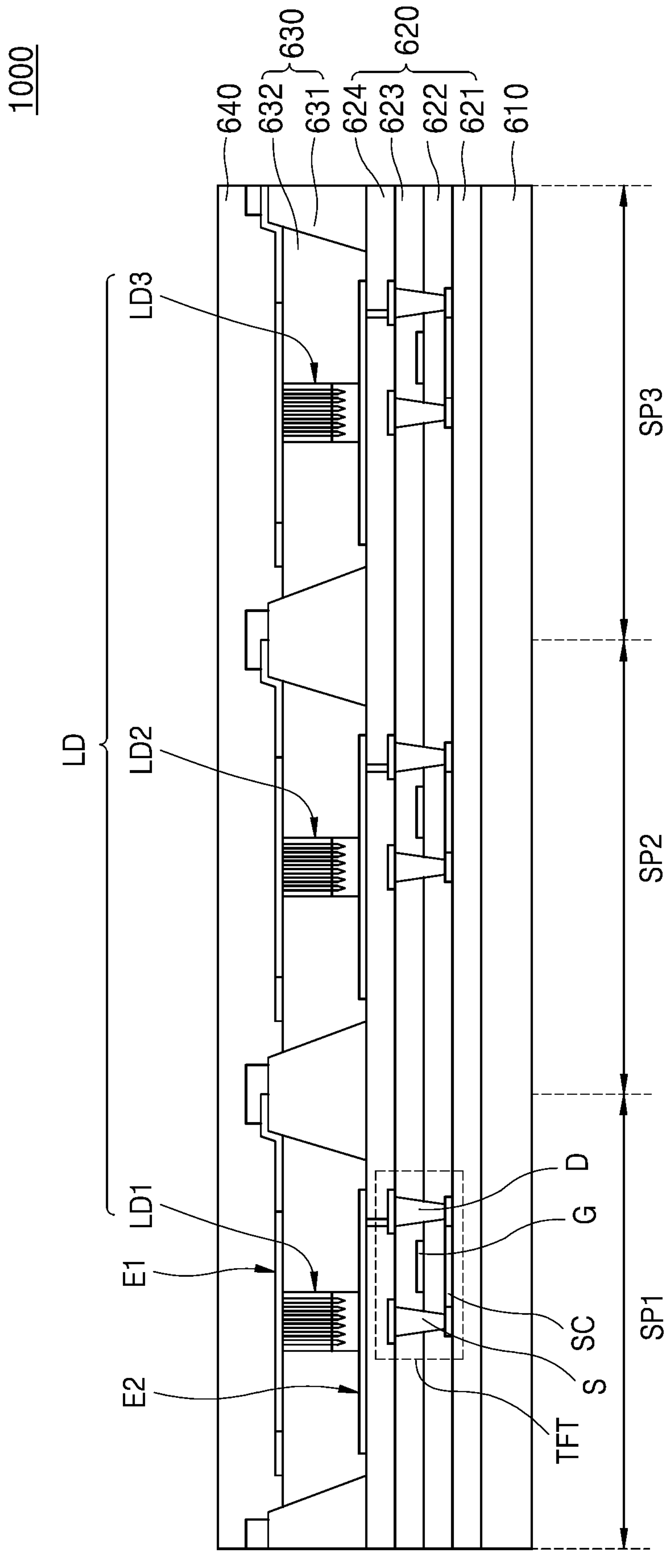
FIG. 24 is a view of a display apparatus according to an embodiment.

FIG. 24 is a view of a display apparatus 1000 according to an embodiment. Referring to FIG. 24, the display apparatus 1000 may include a substrate 610 on which a plurality of pixels are provided. One pixel may include a first sub-pixel SP1, a second sub-pixel SP2, and a third sub-pixel SP3 provided on the substrate 610.

The first to third sub-pixels SP1 to SP3 may be a pixel area of one pixel, in which an image is displayed, and an emission area in which light is emitted.

Each of the first to third sub-pixels SP1 to SP3 may include the substrate 610, a driving device layer 620, a display device layer 630, and a cover structure layer 640.

The substrate 610 may include an insulating material, such as glass, an organic polymer, a crystal, etc. Also, the substrate 610 may include a flexible material to be bent or folded and may have a single-layer structure or a multi-layer structure.

The driving device layer 620 may include a buffer layer 621 arranged on the substrate 610, a transistor TFT arranged on the buffer layer 621, and a driving voltage line (not shown).

The buffer layer 621 may prevent diffusion of impurities to the transistor TFT. The buffer layer 621 may be provided as a single layer, but may also be provided as multiple layers, for example, at least double layers.

When the buffer layer 621 is provided as multiple layers, each layer may include the same material as each other or a different material from each other. The buffer layer 621 may be omitted according to a material and a processing condition of the substrate 610.

The transistor TFT may drive a corresponding light-emitting device from among a plurality of light-emitting devices LD1, LD2, and LD3 included in the display device layer 630. The transistor TFT may include a semiconductor layer SC, a gate electrode G, a source electrode S, and a drain electrode D.

The semiconductor layer SC may be arranged on the buffer layer 621. The semiconductor layer SC may include a source area contacting the source electrode S and a drain area contacting the drain electrode D. A channel area may be provided between the source area and the drain area.

The semiconductor layer SC may include a semiconductor pattern including polysilicon, amorphous silicon, and an oxide semiconductor. The channel area may be a semiconductor pattern not doped with impurities and may be a genuine semiconductor. The source area and the drain area may be semiconductor patterns doped with impurities.

The gate electrode G may be provided on the semiconductor layer SC with a gate insulating layer 622 therebetween.

The source electrode S and the drain electrode D may respectively contact the source area and the drain area of the semiconductor layer SC, through contact holes penetrating an interlayer insulating layer 623 and the gate insulating layer 622.

A protective layer 624 may be provided on the transistor TFT.

The display device layer 630 may include the plurality of light-emitting devices LD1, LD2, and LD3 provided on the protective layer 624. For example, the light-emitting device LD1 in the first sub-pixel SP1 may emit red light, the light-emitting device LD2 in the second sub-pixel SP2 may emit green light, and the light-emitting device LD3 in the third sub-pixel SP3 may emit blue light. By adjusting contents of indium in a manufacturing process of the light-emitting devices LD1 to LD3, wavelengths of light emitted by the light-emitting devices LD1 to LD3 may be differently adjusted.

In FIG. 24, the light-emitting device 100 in FIG. 1 is illustrated, as the light-emitting devices LD1 to LD3. However, at least one of the light-emitting devices LD1 to LD3 in the first to third sub-pixels SP1 to SP3 may include the light-emitting devices described above.

The display device layer 630 may further include a pixel-defining layer 631. The pixel-defining layer 631 may be provided on the protective layer 624 and may define an emission area in each of the first to third sub-pixels SP1 to SP3. The pixel-defining layer 631 may include a hole portion exposing the light-emitting devices LD1, LD2, and LD3 included in the first to third sub-pixels SP1 to SP3, respectively.

Two pixel-defining layers 631 adjacent to each other on the substrate 610 may be apart from each other by a predetermined distance. For example, the two pixel-defining layers 631 adjacent to each other may be apart from each other on the substrate 610 by a distance greater than or equal to a width of the light-emitting devices LD1 to LD3. The pixel-defining layer 631 may include an insulating material including an inorganic material or an organic material, but is not limited thereto.

The pixel-defining layer 631 may include an insulating material including an organic material. For example, the pixel-defining layer 631 may include polystyrene, polymethylmethacrylate (PMMA), polyacrylonitrile (PAN), polyamide (PA), polyimide (PI), polyarylether (PAE), a heterocyclic polymer, parylene, epoxy, benzocyclobutene (BCB), siloxane-based resins, and/or silane-based resins.

An insulating layer 632 may be provided between the pixel-defining layers 631. The insulating layer 632 may surround a side surface of each of the light-emitting devices LD1 to LD3 provided in the first to third sub-pixels SP1 to SP3, respectively. The insulating layer 632 may have a less dielectric rate than the insulating layer 120 included in the light-emitting devices LD1 to LD3. Thus, light emitted by the light-emitting devices LD1 to LD3 may be reflected by the insulating layer 632, so that more light may be emitted in a thickness direction of the light-emitting devices LD1 to LD3.

A first electrode E1 may be arranged on the insulating layer 632, and a second electrode E2 may be arranged on the protective layer 624. The first electrode E1 may include the transparent electrode 130 of FIG. 1, and the second electrode E2 may include the reflective electrode 140 of FIG. 1.

Accordingly, a driving voltage may be applied to a corresponding light-emitting device LD through the first electrode E1, and a voltage of the transistor TFT may be applied to a corresponding light-emitting device LD through the second electrode E2. As a result, a predetermined voltage may be applied to both ends of the light-emitting device LD through the first and second electrodes E1 and E2, and thus, the light-emitting device LD may emit light. A wavelength of light emitted by the light-emitting device LD 1 to LD3 may vary depending on a content of indium.

An overcoat layer 640 may be provided on the insulating layer 632. The overcoat layer 640 may be a planarization layer reducing a step difference generated due to component arranged therebelow. Also, the overcoat layer 640 may be an encapsulation layer preventing penetration of, for example, oxygen or water into the light-emitting device LD 1 to LD3.

When the light-emitting devices LD1, LD2, and L3 included in the sub-pixels SP1, SP2, and SP3, respectively, emit light having the same wavelength as each other or light of a combination of different wavelengths, for example, white light, a display apparatus may further include a color-conversion layer.

Figure 25:
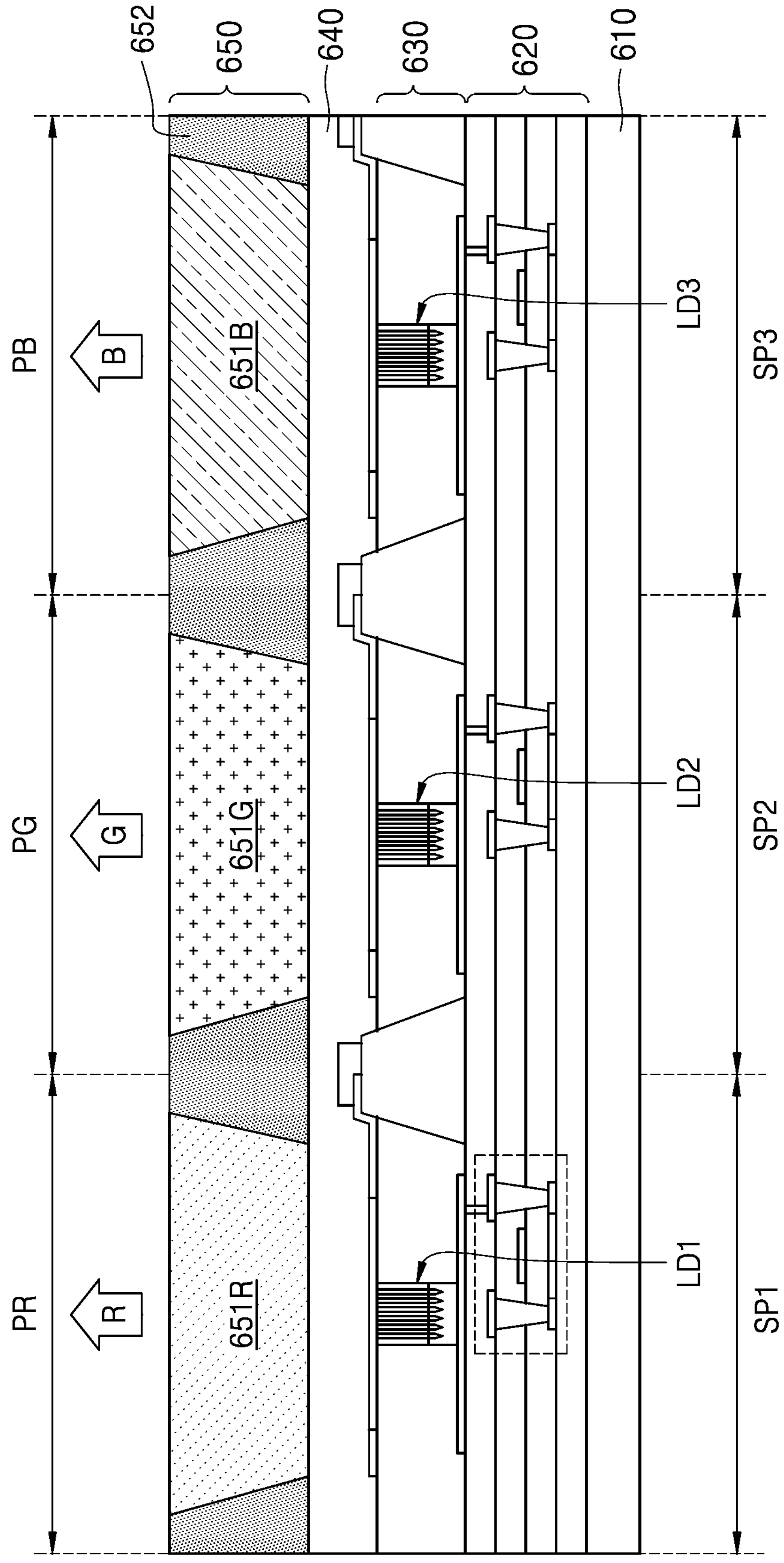
FIG. 25 is a view of a display apparatus according to an embodiment.

FIG. 25 is a view of a display apparatus according to an embodiment. To compare the display apparatuses of FIGS. 24 and 25, the display apparatus of FIG. 25 may further include a color-conversion layer 650 converting light incident from a display device layer into light of a predetermined wavelength. The color-conversion layer 650 may include first to third color-conversion patterns 651R, 651G, and 651B. Here, each of the first to third color-conversion patterns 651R, 651G, and 651G may correspond to each sub-pixel. For example, the first color-conversion pattern 651R may correspond to the first sub-pixel SP1, the second color-conversion pattern 651G may correspond to the second sub-pixel SP2, and the third color-conversion pattern 651G may correspond to the third sub-pixel SP3.

A light-emitting device according to an embodiment may include light-emitting rods each having a core-shell structure, and thus, an active layer may have an increased surface area, and surface recombination may be reduced. Thus, light extraction efficiency may be increased.

With respect to a light-emitting device, light-emitting rods may be grown by using a bottom-up scheme, by which the light-emitting rods are selectively grown, and thus, the light-emitting rods may not be damaged, and thus, may have high light extraction efficiency.

Light-emitting rods may be grown on a membrane crystallized and apart from a base layer with cavities between the membrane and the base layer, and thus, stress which may occur in the light-emitting rods may be reduced, and the light-emitting rods may have a less defect density.

A large quantity of light-emitting devices may be transferred, and thus, it may become easy to manufacture a display apparatus.

The light-emitting devices, display apparatuses including the same, and methods of manufacturing the light-emitting devices and the display apparatuses are described above according to embodiments illustrated in the drawings. However, the descriptions are only examples, and one of ordinary skill in the art may understand that various modifications and equivalent embodiments are possible from the descriptions. Various detailed configurations are described above. However, they should not limit the scope of the disclosure and should be interpreted as detailed examples of embodiments. Therefore, the scope of the disclosure should be defined by the technical concept described in the claims, rather than the embodiments described above.

It should be understood that the embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a plurality of light-emitting rods, each of the plurality of light-emitting rods comprising:

a first semiconductor layer having a rod shape, an active layer having a shell shape disposed about a plurality of surfaces of the first semiconductor layer, and a second semiconductor layer having a shell shape disposed about a plurality of surfaces of the active layer;

an insulating layer disposed in spaces between the plurality of light-emitting rods;

a transparent electrode electrically connected to the first semiconductor layer of each of the plurality of light-emitting rods; and a reflective electrode electrically connected to the second semiconductor layer of each of the plurality of light-emitting rods, wherein the transparent electrode comprises a transparent conductive material comprising an oxide, wherein a width of the first semiconductor layer of a first light-emitting rod, among the plurality of light-emitting rods, is smaller than a width of the first semiconductor layer of a second light-emitting rod, among the plurality of light-emitting rods, wherein an indium content per unit area of the active layer of the first light-emitting rod is greater than an indium content per unit area of the active layer of the second light-emitting rod, and wherein a wavelength of light emitted from the first light-emitting rod is longer than a wavelength of light emitted from the second light-emitting rod.

2. The light-emitting device of claim 1, wherein a thickness of the reflective electrode is greater than a thickness of the transparent electrode.

3. The light-emitting device of claim 1, wherein a thickness of the reflective electrode is greater than or equal to 100 nm, and wherein a thickness of the transparent electrode is greater than or equal to 10 nm and less than 100 nm.

4. The light-emitting device of claim 1, wherein the first semiconductor layer of each of the plurality of light-emitting rods coplanarly contacts the transparent electrode, and wherein a portion of the second semiconductor layer of each of the plurality of light-emitting rods is embedded in the reflective electrode.

5. The light-emitting device of claim 1, wherein the first semiconductor layer comprises a portion protruding from the active layer and the second semiconductor layer.

6. The light-emitting device of claim 1, wherein the insulating layer comprises:

a first insulating layer in contact with a side surface of the first semiconductor layer; and a second insulating layer in contact with a side surface of the second semiconductor layer.

7. The light-emitting device of claim 1, further comprising a common semiconductor layer in contact with the first semiconductor layer of each of the plurality of light-emitting rods, wherein the transparent electrode is electrically connected to the first semiconductor layer of each of the plurality of light-emitting rods, through the common semiconductor layer.

8. A display apparatus comprising:

a substrate; and a display device layer arranged on the substrate and comprising a plurality of light-emitting devices, wherein at least one of the plurality of light-emitting devices comprises:

a reflective electrode arranged on the substrate;

a transparent electrode arranged to be apart from the reflective electrode in a thickness direction of the substrate; and a plurality of light-emitting rods arranged between the reflective electrode and the transparent electrode and each comprising:

a first semiconductor layer having a rod shape, an active layer having a shell shape disposed about a plurality of surfaces of the first semiconductor layer, and a second semiconductor layer having a shell shape disposed about a plurality of surfaces of the active layer, and wherein the transparent electrode comprises a transparent conductive material comprising an oxide, wherein a width of the first semiconductor layer of a first light-emitting rod, among the plurality of light-emitting rods, is smaller than a width of the first semiconductor layer of a second light-emitting rod, among the plurality of light-emitting rods, wherein an indium content per unit area of the active layer of the first light-emitting rod is greater than an indium content per unit area of the active layer of the second light-emitting rod, and wherein a wavelength of light emitted from the first light-emitting rod is longer than a wavelength of light emitted from the second light-emitting rod.

9. The display apparatus of claim 8, wherein a thickness of the reflective electrode is greater than a thickness of the transparent electrode.

10. The display apparatus of claim 8, wherein the first semiconductor layer of each of the plurality of light-emitting rods coplanarly contacts the transparent electrode, and wherein a portion of the second semiconductor layer of each of the plurality of light-emitting rods is embedded in the reflective electrode.

11. The display apparatus of claim 8, further comprising:

a first insulating layer in contact with a side surface of the first semiconductor layer; and a second insulating layer in contact with a side surface of the second semiconductor layer.

12. The display apparatus of claim 8, further comprising a common semiconductor layer in contact with the first semiconductor layer of each of the plurality of light-emitting rods, wherein the transparent electrode is electrically connected to the first semiconductor layer of each of the plurality of light-emitting rods through the common semiconductor layer.

13. The display apparatus of claim 8, wherein the substrate comprises a driving layer comprising a transistor configured to drive the plurality of light-emitting devices.

14. The display apparatus of claim 8, wherein the plurality of light-emitting devices comprises:

a first light-emitting device comprising a plurality of first light-emitting rods having a first width;

a second light-emitting device comprising a plurality of second light-emitting rods having a second width that is less than the first width; and a third light-emitting device comprising a plurality of third light-emitting rods having a third width that is less than the second width.

15. The light-emitting device of claim 1, wherein the first semiconductor layer comprises a nitride semiconductor.

16. The light-emitting device of claim 15, wherein the transparent conductive material comprises indium tin oxide (ITO) or indium zinc oxide (IZO).

17. The light-emitting device of claim 1, wherein the reflective electrode comprises a first surface that is non-planar and in contact with the plurality of light-emitting rods, and a second surface that is planar and opposite to the first surface.

18. The display apparatus of claim 8, wherein the reflective electrode comprises a first surface that is non-planar and in contact with the plurality of light-emitting rods, and a second surface that is planar and opposite to the first surface.

* * * * *